US012277017B2

(12) United States Patent
Troia

(10) Patent No.: US 12,277,017 B2
(45) Date of Patent: Apr. 15, 2025

(54) OPERATING MODE REGISTER

(71) Applicant: Micron Technology, Inc., Boise, ID (US)

(72) Inventor: Alberto Troia, Munich (DE)

(*) Notice: Subject to any disclaimer, the term of this patent is extended or adjusted under 35 U.S.C. 154(b) by 57 days.

(21) Appl. No.: 17/977,484

(22) Filed: Oct. 31, 2022

(65) Prior Publication Data
US 2023/0052624 A1 Feb. 16, 2023

Related U.S. Application Data

(63) Continuation of application No. 16/554,877, filed on Aug. 29, 2019, now Pat. No. 11,487,339.

(51) Int. Cl.
G06F 1/3225 (2019.01)
G06F 1/3234 (2019.01)
G11C 11/406 (2006.01)
G11C 11/409 (2006.01)

(52) U.S. Cl.
CPC .......... *G06F 1/3225* (2013.01); *G06F 1/3275* (2013.01); *G11C 11/406* (2013.01); *G11C 11/409* (2013.01)

(58) Field of Classification Search
CPC ... G06F 1/3225; G06F 1/3275; G11C 7/1006; G11C 7/1045
See application file for complete search history.

(56) References Cited

U.S. PATENT DOCUMENTS

| 5,602,999 | A | 2/1997 | Hyatt |
| 6,928,590 | B2 | 8/2005 | Ilkbahar et al. |
| 8,929,169 | B1* | 1/2015 | Yang ............ G11C 5/147 |
| | | | 713/320 |
| 10,854,245 | B1* | 12/2020 | Shah ............ G06F 1/3275 |
| 11,487,339 | B2* | 11/2022 | Troia ............ G11C 7/1006 |
| 2002/0191472 | A1 | 12/2002 | Okamoto et al. |
| 2003/0028711 | A1* | 2/2003 | Woo ............ G06F 1/3225 |
| | | | 711/106 |
| 2003/0131206 | A1 | 7/2003 | Atkinson et al. |
| 2005/0289365 | A1* | 12/2005 | Bhandarkar ...... G06F 1/3287 |
| | | | 713/300 |
| 2007/0033425 | A1* | 2/2007 | Clark ............ G06F 9/3891 |
| | | | 712/E9.071 |

(Continued)

FOREIGN PATENT DOCUMENTS

WO 2018022835 2/2018

OTHER PUBLICATIONS

Sebastian et al., "Temporal Correlation Detection Using Computational Phase-change Memory", Nature Communications Journal 8, Article No. 1115, Oct. 24, 2017, pp. 1-10.

(Continued)

*Primary Examiner* — Vincent H Tran
(74) *Attorney, Agent, or Firm* — Brooks, Cameron & Huebsch, PLLC

(57) ABSTRACT

The present disclosure includes apparatuses and methods related to modifying an operating mode in memory. An example apparatus can include a memory array and a controller coupled to the memory array, wherein the controller includes a register configured to receive a mode register write command and write a value indicative of an operating mode in which the apparatus has reduced power consumption relative to a normal operating mode.

20 Claims, 8 Drawing Sheets

(56) References Cited

U.S. PATENT DOCUMENTS

| | | | |
|---|---|---|---|
| 2007/0288783 A1 | 12/2007 | Ogasawara et al. | |
| 2008/0056051 A1* | 3/2008 | Mayer | G11C 11/4093 |
| | | | 365/230.03 |
| 2009/0150602 A1 | 6/2009 | Sauber | |
| 2009/0245007 A1* | 10/2009 | Kaburlasos | G11C 7/1006 |
| | | | 365/230.01 |
| 2010/0138684 A1* | 6/2010 | Kim | G06F 1/3225 |
| | | | 713/600 |
| 2010/0287391 A1 | 11/2010 | Ochiai | |
| 2011/0252180 A1* | 10/2011 | Hendry | G06F 3/0647 |
| | | | 711/3 |
| 2013/0097449 A1 | 4/2013 | Priel et al. | |
| 2013/0222009 A1 | 8/2013 | Kang | |
| 2014/0201553 A1* | 7/2014 | Dressler | G06F 1/28 |
| | | | 713/324 |
| 2014/0298056 A1 | 10/2014 | Seki et al. | |
| 2014/0365715 A1 | 12/2014 | Lee | |
| 2015/0006925 A1 | 1/2015 | Branover et al. | |
| 2015/0227188 A1 | 8/2015 | Ware et al. | |
| 2015/0287461 A1 | 10/2015 | Song | |
| 2015/0355839 A1 | 12/2015 | Shim | |
| 2016/0077560 A1* | 3/2016 | Stickel | G06F 1/26 |
| | | | 713/310 |
| 2016/0132339 A1 | 5/2016 | Oh et al. | |
| 2016/0139649 A1* | 5/2016 | Kim | G06F 1/3275 |
| | | | 713/320 |
| 2017/0024644 A1 | 1/2017 | Van Der Made et al. | |
| 2017/0110176 A1* | 4/2017 | Kim | G11C 11/40615 |
| 2017/0228186 A1* | 8/2017 | Healy | G06F 3/0632 |
| 2018/0074739 A1 | 3/2018 | Healy et al. | |
| 2018/0107433 A1 | 4/2018 | Prather | |
| 2018/0189638 A1 | 7/2018 | Nurvitadhi et al. | |
| 2018/0203643 A1 | 7/2018 | Pedersen | |
| 2018/0329467 A1 | 11/2018 | Dressler et al. | |
| 2019/0042538 A1 | 2/2019 | Koren et al. | |
| 2019/0065243 A1* | 2/2019 | Eckert | G06F 1/3225 |
| 2019/0094946 A1 | 3/2019 | Pillilli et al. | |
| 2019/0180795 A1 | 6/2019 | Doo et al. | |
| 2019/0189181 A1 | 6/2019 | Pardeik et al. | |
| 2019/0205253 A1 | 7/2019 | Roberts | |
| 2019/0205737 A1 | 7/2019 | Bleiweiss et al. | |
| 2019/0235867 A1 | 8/2019 | Jaffari et al. | |
| 2019/0304530 A1 | 10/2019 | Choi | |
| 2019/0361516 A1 | 11/2019 | Bhattacharyya et al. | |
| 2020/0117597 A1 | 4/2020 | Huang et al. | |
| 2020/0143850 A1* | 5/2020 | Kim | H03K 19/1733 |
| 2020/0293467 A1 | 9/2020 | Ma et al. | |

OTHER PUBLICATIONS

Rios et al., "In-Memory Computing on a Photonic Platform", Jan. 18, 2018, Cornell University arXiv, retrieved from https://arxiv.org/abs/1801.06228.

"A New Brain-inspired Architecture Could Improve How Computers Handle Data and Advance AI", Oct. 3, 2018, American Institute of Physics, retrieved from https://phys.org/news/2018-10-brain-inspired-architecture-advance-ai.html.

International Search Report and Written Opinion for related PCT Application No. PCT/US2020/048144, dated Nov. 30, 2020, 12 pages.

* cited by examiner

| | BIT 7 334-7 | BIT 6 334-6 | BIT 5 334-5 | BIT 4 334-4 | BIT 3 334-3 | BIT 2 334-2 | BIT 1 334-1 | BIT 0 334-0 |
|---|---|---|---|---|---|---|---|---|
| 332-0 | | | RESTART 360 | START 361 | CONTENT VAL. 362 | CLR CONTENT 363 | IN USE 364 | EXIT 365 |
| 332-1 | | | | | | | | |
| 332-2 | INPUT SIZE 336 | | | | | | | |
| 332-3 | NUMBER OF INPUTS 367 | | | | | | | |
| 332-4 | 368 INPUT SA | | | | | | | |
| 332-5 | 369 INPUT EA | | | | | | | |
| 332-6 | | | | | | | | |
| 332-7 | OUTPUT SIZE 370 | | | | | | | |
| 332-8 | NUMBER OF OUTPUTS 371 | | | | | | | |
| 332-9 | 372 OUTPUT SA | | | | | | | |
| 332-10 | 373 OUTPUT EA | | | | | | | |
| 332-11 | ENABLE TEMP 374 | ENABLE TEMP 375 | ENABLE AF 376 | ENABLE BIAS 377 | ENAB OUTPUT 378 | ENABLE NN 379 | ENABLE INPUT 380 |
| 332-12 | NUMBER OF ROWS 381 | | | | | | | |
| 332-13 | NUMBER OF COLUMNS 382 | | | | | | | |
| 332-14 | | | | | | | | |
| 332-15 | NEURON SIZE 383 | | | | | | | |
| 332-16 | NUMBER OF NEURONS 384 | | | | | | | |
| 332-17 | 385 NEURON SA | | | | | | | |
| 332-18 | 386 NEURON EA | | | | | | | |
| 332-19 | | | | | | | | |
| 332-20 | NUMBER OF LAYERS 387 | | | | | | | |
| 332-21 – 332-25 | | | | | | | | |

*Fig. 3A*

| | BIT 7 334-7 | BIT 6 334-6 | BIT 5 334-5 | BIT 4 334-4 | BIT 3 334-3 | BIT 2 334-2 | BIT 1 334-1 | BIT 0 334-0 |
|---|---|---|---|---|---|---|---|---|
| 332-26 | | | | | | | | |
| 332-27 | | | | | | | | 391 |
| 332-28 | | | | | TEMP VALID 388 | TEMP VALID 389 | FORWARD 390 | APPLY ACT FNC |
| 332-29 | | | | STOP LAYER 392 | | | | |
| 332-30 | | | TEMP START ADDRESS 393 | | | | | |
| 332-31 | | | | TEMP SIZE 395 | | TEMP END ADDRESS 394 | | |
| 332-32 | | | TEMP START ADDRESS 396 | | | | | |
| 332-33 | | | | | 398 | 399 | TEMP END ADDRESS 397 | |
| 332-34 | | | | | ENABLE EXT ACT FUNC | HOLD AT LAYER | HOLD AT NEURON | ENABLE INT ACT FUNC 3101 3110 |
| 332-35 | | | ACTIVATION FUNCTION START ADDRESS 3102 | | | ACTIVATION FUNCTION END ADDRESS 3103 | | |
| 332-36 | | | | ACTIVATION FUNCTION X-AXIS RESOLUTION 3104 | | | | |
| 332-37 | | | | ACTIVATION FUNCTION Y-AXIS RESOLUTION 3105 | | | | |
| 332-38 | | | | | | BIAS VALUE SIZE 3106 | | |
| 332-39 | | | NUMBER OF BIAS VALUES 3107 | | 3111 3112 | | | |
| 332-40 | | | | | | | | |
| 332-41 | | | BIAS VALUES START ADDRESS 3108 | | FORWARD 3110 | | | |
| 332-42 | | | | | | BIAS VALUES END ADDRESS 3109 | | |
| 332-43 | | | | | MATRX CALC | AI ACCELER | BUSY | DEBG/ON-HOLD 3113 3114 |
| 332-44 | | | | | SEQ ERROR 3115 | ALGOR ERROR 3116 | PAGE ERROR 3117 | ECC USED 3118 |
| 332-45 | | | | | | | | |
| 332-46 | CUST ACT FNC 3119 | | SELECT ACTIVATION FUNCTION 3120 | | | | | |
| 332-47 | | | | ADDRESS OF NEURON/LAYER BEING EXECUTED 3121 | | | | |
| 332-48 | | | | | | | | |
| 332-49 | | | | OPERATING MODE 3122 | | | | |
| 332-50 | | | | | | | | |
| 332-51 | | | | | | | | |

*Fig. 3B*

OPERATING MODE REGISTER

PRIORITY INFORMATION

This application is a Continuation of U.S. application Ser. No. 16/554,877, filed Aug. 29, 2019, contents of which are incorporated herein by reference.

TECHNICAL FIELD

The present disclosure relates generally to memory devices, and more particularly, to apparatuses and methods for modifying an operating mode in memory.

BACKGROUND

Memory devices are typically provided as internal, semiconductor, integrated circuits in computers or other electronic devices. There are many different types of memory including volatile and non-volatile memory. Volatile memory can require power to maintain its data and includes random-access memory (RAM), dynamic random access memory (DRAM), and synchronous dynamic random access memory (SDRAM), among others. Non-volatile memory can provide persistent data by retaining stored data when not powered and can include NAND flash memory, NOR flash memory, read only memory (ROM), Electrically Erasable Programmable ROM (EEPROM), Erasable Programmable ROM (EPROM), and resistance variable memory such as phase change random access memory (PCRAM), resistive random access memory (RRAM), and magnetoresistive random access memory (MRAM), among others.

Memory is also utilized as volatile and non-volatile data storage for a wide range of electronic applications. Non-volatile memory may be used in, for example, personal computers, portable memory sticks, digital cameras, cellular telephones, portable music players such as MP3 players, movie players, and other electronic devices. Memory cells can be arranged into arrays, with the arrays being used in memory devices.

BRIEF DESCRIPTION OF THE DRAWINGS

FIGS. 3A and 3B are block diagrams of a number of bits in a number of registers on a memory device with an artificial intelligence (AI) accelerator in accordance with a number of embodiments of the present disclosure.

DETAILED DESCRIPTION

Figure 1A:
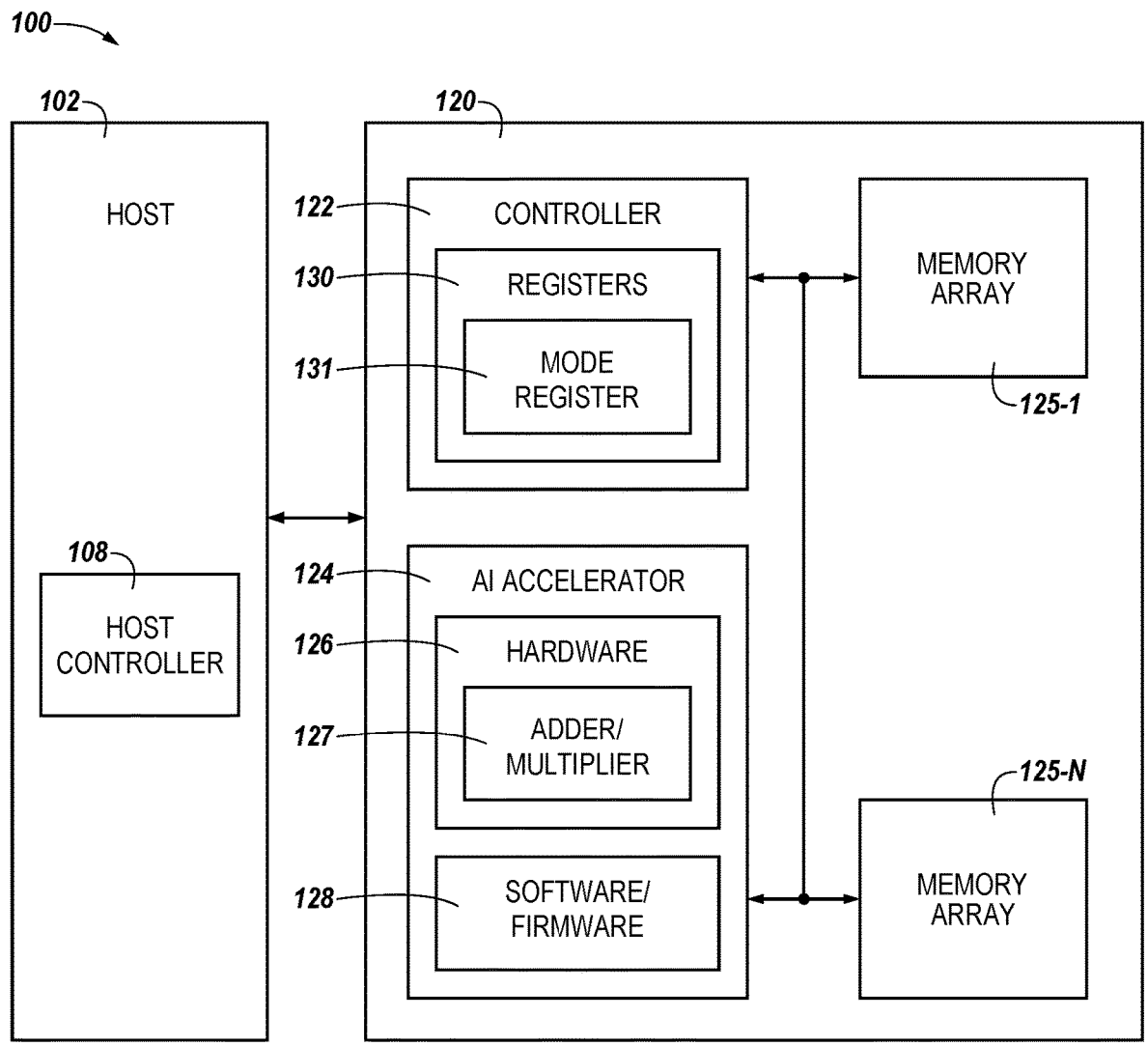
FIG. 1A is a block diagram of an apparatus in the form of a computing system including a memory device with an artificial intelligence (AI) accelerator in accordance with a number of embodiments of the present disclosure.

The present disclosure includes apparatuses and methods related to modifying an operating mode in memory. The operating modes for a memory device can include a reduced power consumption mode where the memory device does not perform refresh operations and the command interface of the memory device only accepts commands to place the memory device in an increased power consumption mode (e.g., a normal operating mode). An example apparatus can include a memory array and a controller coupled to the memory array, wherein the controller includes a register configured to receive a mode register write command and write a value indicative of an operating mode in which the apparatus has reduced power consumption relative to a normal operating mode.

Often artificial intelligence (AI) systems access several memory components at once, which can increase power consumption. Modifying the operating mode of memory devices to a reduced power consumption mode can reduce the power consumption of the memory device and can reduce the overall power consumption of a system, including artificial intelligence systems.

Modifying an operating mode can include reducing power consumption and/or increasing power consumption of a memory device by writing a value indicative of the operating mode to a register on a controller in response to receiving a mode register write command. The controller can further include a different register that can be written to a value indicative of performing an artificial intelligence operation. An artificial intelligence (AI) accelerator can perform the artificial intelligence operation using data stored in the memory array.

In the following detailed description of the present disclosure, reference is made to the accompanying drawings that form a part hereof, and in which is shown by way of illustration how a number of embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, the designator "N" indicates that a number of the particular feature so designated can be included with a number of embodiments of the present disclosure.

As used herein, "a number of" something can refer to one or more of such things. For example, a number of memory devices can refer to one or more of memory devices. Additionally, designators such as "N" and "X", as used herein, particularly with respect to reference numerals in the drawings, indicates that a number of the particular feature so designated can be included with a number of embodiments of the present disclosure.

The figures herein follow a numbering convention in which the first digit or digits correspond to the drawing figure number and the remaining digits identify an element or component in the drawing. Similar elements or components between different figures may be identified by the use of similar digits. As will be appreciated, elements shown in the various embodiments herein can be added, exchanged, and/or eliminated so as to provide a number of additional embodiments of the present disclosure. In addition, the proportion and the relative scale of the elements provided in the figures are intended to illustrate various embodiments of the present disclosure and are not to be used in a limiting sense.

FIG. 1A is a block diagram of an apparatus in the form of a computing system 100 including a memory device 120 in accordance with a number of embodiments of the present disclosure. As used herein, a memory device 120, memory arrays 125-1, . . . 125-N, memory controller 122, and/or AI accelerator 124 might also be separately considered an "apparatus."

As illustrated in FIG. 1A, host 102 can be coupled to the memory device 120. Host 102 can be a laptop computer, personal computers, digital camera, digital recording and playback device, mobile telephone, PDA, memory card reader, interface hub, among other host systems, and can include a memory access device, e.g., a processor. One of ordinary skill in the art will appreciate that "a processor" can intend one or more processors, such as a parallel processing system, a number of coprocessors, etc.

Host 102 includes a host controller 108 to communicate with memory device 120. The host controller 108 can send commands to the memory device 120. The host controller 108 can communicate with the memory device 120, memory controller 122 on memory device 120, and/or the AI accelerator 124 on memory device 120 to perform AI operations, read data, write data, and/or erase data, among other operations. A physical host interface can provide an interface for passing control, address, data, and other signals between memory device 120 and host 102 having compatible receptors for the physical host interface. The signals can be communicated between host 102 and memory device 120 on a number of buses, such as a data bus and/or an address bus, for example. Host 102 and memory device 120 may communicate using one or several protocols, including a standardized protocol or protocols that may provide for coherency (e.g., cache coherency) among several devices that share memory resources. In some examples, host 102 and memory device 120 communicate using Compute Express Link (CXL), Cache Coherent Interconnect for Accelerators (CCIX), Gen-Z, Open Coherent Accelerator Processor Interface (OpenCAPI), JEDEC's LPDDRx, JEDEC's NVDIMM-P, or Peripheral Component Interconnect Express (PCIe), or some combination of such interface standards.

Memory device 120 can include controller 120, AI accelerator 124, and memory arrays 125-1, . . . , 125-N. Memory device 120 can be a low-power double data rate dynamic random access memory, such as a LPDDR5 device, and/or a graphics double data rate dynamic random access memory, such as a GDDR6 device, among other types of devices. Memory arrays 125-1, . . . , 125-N can include a number of memory cells, such as volatile memory cells (e.g., DRAM memory cells, among other types of volatile memory cells) and/or non-volatile memory cells (e.g., RRAM memory cells, among other types of non-volatile memory cells). Memory device 120 can read and/or write data to memory arrays 125-1, . . . , 125-N. Memory arrays 125-1, . . . , 125-N can store data that is used during AI operations performed on memory device 120. Memory arrays 125-1, . . . , 125-N can store inputs, outputs, weight matrix and bias information of a neural network, and/or activation functions information used by the AI accelerator to perform AI operations on memory device 120.

The host controller 108, memory controller 122, and/or AI accelerator 124 on memory device 120 can include control circuitry, e.g., hardware, firmware, and/or software. In one or more embodiments, the host controller 108, memory controller 122, and/or AI accelerator 124 can be an application specific integrated circuit (ASIC) coupled to a printed circuit board including a physical interface. Also, memory controller 122 on memory device 120 can include registers 130. Registers 130 can be programmed to provide information for the AI accelerator to perform AI operations. Registers 130 can include any number of registers. Registers 130 can be written to and/or read by host 102, memory controller 122, and/or AI accelerator 124. Registers 130 can provide input, output, neural network, and/or activation functions information for AI accelerator 124. Registers 130 can include mode register 131 to select a mode of operation for memory device 120. The AI mode of operation can be selected by writing a word to register 131, such as 0xAA and/or 0x2AA, for example, which inhibits access to the registers associated with normal operation of memory device 120 and allows access to the registers associated with AI operations. Also, the AI mode of operation can be selected using a signature that uses a crypto algorithm that is authenticated by a key stored in the memory device 120. Registers 130 can also be located in memory arrays 125-1, . . . , 125-N and be accessible by controller 122.

AI accelerator 124 can include hardware 126 and/or software/firmware 128 to perform AI operations. Hardware 126 can include adder/multiplier 126 to perform logic operations associated with AI operations. Memory controller 122 and/or AI accelerator 124 can received commands from host 102 to perform AI operations. Memory device 120 can perform the AI operations requested in the commands from host 102 using the AI accelerator 124, data in memory arrays 125-1, . . . , 125-N, and information in registers 130. The memory device can report back information, such as results and/or error information, for example, of the AI operations to host 102. The AI operations performed by AI accelerator 124 can be performed without use of an external processing resource.

The memory arrays 125-1, . . . , 125-N can provide main memory for the memory system or could be used as additional memory or storage throughout the memory system. Each memory array 125-1, . . . , 125-N can include a number of blocks of memory cells. The blocks of memory cells can be used to store data that is used during AI operations performed by memory device 120. Memory arrays 125-1, . . . , 125-N can include DRAM memory cells, for example. Embodiments are not limited to a particular type of memory device. For instance, the memory device can include RAM, ROM, DRAM, SDRAM, PCRAM, RRAM, 3D XPoint, and flash memory, among others.

The embodiment of FIG. 1a can include additional circuitry that is not illustrated so as not to obscure embodiments of the present disclosure. For example, memory device 120 can include address circuitry to latch address signals provided over I/O connections through I/O circuitry. Address signals can be received and decoded by a row decoder and a column decoder to access the memory arrays 125-1, . . . , 125-N. It will be appreciated by those skilled in the art that the number of address input connections can depend on the density and architecture of the memory arrays 125-1, . . . , 125-N.

Figure 1B:
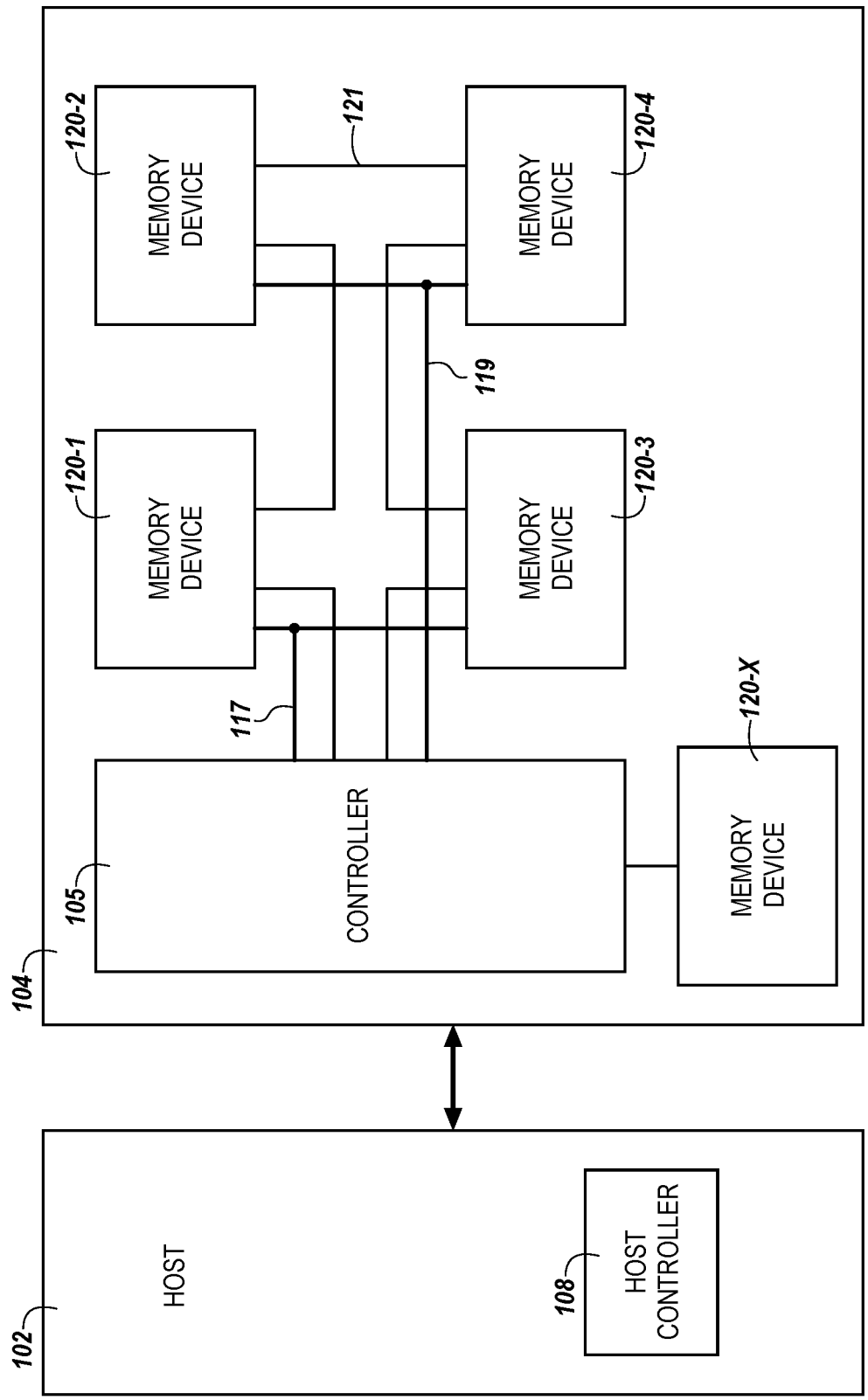
FIG. 1B is a block diagram of an apparatus in the form of a computing system including a memory system with memory devices having an artificial intelligence (AI) accelerator in accordance with a number of embodiments of the present disclosure.

FIG. 1B is a block diagram of an apparatus in the form of a computing system including a memory system with memory devices having an artificial intelligence (AI) accelerator in accordance with a number of embodiments of the present disclosure. As used herein, memory devices 120-1, 120-2, 120-3, 1204-4, and 120-X, controller 10, and/or memory system 104 might also be separately considered an "apparatus."

As illustrated in FIG. 1B, host 102 can be coupled to the memory system 104. Host 102 can be a laptop computer, personal computers, digital camera, digital recording and playback device, mobile telephone, PDA, memory card reader, interface hub, among other host systems, and can include a memory access device, e.g., a processor. One of ordinary skill in the art will appreciate that "a processor" can intend one or more processors, such as a parallel processing system, a number of coprocessors, etc.

Host 102 includes a host controller 108 to communicate with memory system 104. The host controller 108 can send commands to the memory system 104. The memory system 104 can include controller 105 and memory devices 120-1, 120-2, 120-3, 120-4, and 120-X. Memory device 120-1, 120-2, 120-3, 120-4, and 120-X can be the memory device 120 described above in association with FIG. 1A and include an AI accelerator with hardware and/or software/firmware to perform AI operations. The host controller 108 can communicate with controller 105 and/or memory devices 120-1, 120-2, 120-3, 120-4, and 120-X to perform AI operations, read data, write data, and/or erase data, among other operations. A physical host interface can provide an interface for passing control, address, data, and other signals between memory system 104 and host 102 having compatible receptors for the physical host interface. The signals can be communicated between host 102 and memory system 104 on a number of buses, such as a data bus and/or an address bus, for example.

Memory system 104 can include controller 105 coupled to memory devices 120-1, 120-2, 120-3, and 120-4 via bus 121. Bus 121 can be configured such that the full bandwidth of bus 121 can be consumed when operation a portion or all of the memory devices of a memory system. For example, two memory devices of the four memory device 120-1, 120-2, 120-3, and 120-4 shown in FIG. 1B can be configured to operate while using the full bandwidth of bus 121. Controller 105 can send a command on select line 117 that can select memory devices 120-1 and 120-3 for operation during a particular time period, such as at the same time. Controller 105 can send a command on select line 119 that can select memory device 120-2 and 120-X for operation during a particular time period, such as at the same time. In a number of embodiments, controller 105 can be configured to send commands on select lines 117 and 119 to select any combination of the memory devices 120-1, 120-2, 120-3, and 120-4.

In a number of embodiments, a command on select line 117 can be used to select memory devices 120-1 and 120-3 and a command on select line 119 can be used to select memory devices 120-2 and 120-4. The selected memory device can be used during performance of AI operations. Data associated with the AI operation can be copied and/or transferred between the selected memory devices 120-1, 120-2, 120-3, and 120-4 on bus 121

The select line 117 can be used to modify an operating mode to power on (e.g., maintaining and/or restoring power supply) and/or power off (e.g., removing power supply) memory devices 120-1 and 120-3 and select line 119 can be used to modify an operating mode to power on (e.g., normal operating mode and/or increased power consumption mode) and/or power off (e.g., reduced power consumption mode) memory devices 120-2 and 120-4. One or more of the memory devices 120-1, 120-2, 120-3, and 120-4 can be in a reduced power consumption mode to control power consumption of the memory system 104. In some examples, one or more of the memory devices 120-1, 120-2, 120-3, and 120-4 can be in a reduced power consumption mode, where the one or more memory devices 120-1, 120-2, 120-3, and 120-4 have reduced power consumption relative to a normal operating mode, to allow more power to be directed to one or more of the memory devices 120-1, 120-2, 120-3, and 120-4 that are in the normal operating mode and/or an increased power consumption mode, where the one or more memory devices 120-2, 120-3, and 120-4 have increased power consumption relative to the reduced power consumption mode, to perform AI operations. For example, host controller 108 and/or memory system controller 104 can send a mode register write command to modify the operating modes of memory devices 120-1 and 120-3 to reduced power consumption modes to conserve power and/or send a mode register write command to modify the operating modes of memory devices 120-2 and 120-4 to normal operating modes and/or increased power consumption modes to perform AI operations. In some examples, the one or more memory devices 120-1, 120-2, 120-3, and 120-4 can be placed in a reduced power consumption mode by removing a power supply.

One or more of the memory devices 120-1, 120-2, 120-3, and 120-4 operating mode can be modified to a reduced power consumption mode where one or more of the memory devices 120-1, 120-2, 120-3, and 120-4 do not perform refresh operations and/or the command interface only accepts commands to place one or more of the memory devices 120-1, 120-2, 120-3, and 120-4 in a normal operating mode and/or increased power consumption mode. For example, a power supply to a command/address bus (e.g., select lines 117 and 119) of the memory device can be maintained based at least in part on a minimum power level for the one or more memory devices 120-1, 120-2, 120-3, and 120-4 to be able to receive mode register write or mode register read commands. Before going into a reduced power consumption mode, one or more of the memory devices 120-1, 120-2, 120-3, and 120-4 can send data to a different memory device. The different memory device can be one or more of the memory devices 120-1, 120-2, 120-3, and 120-4 and/or memory device 120-X. Memory device 120-X can include volatile and/or non-volatile memory. For example, memory device 120-X can be non-volatile memory and can store operating system (OS) data, applications, and user data when the memory system and/or one or more of the memory devices 120-1, 120-2, 120-3, and 120-4 are powered off.

In a number of embodiments, applications performed by a memory device can include AI operations. In response to one or more memory devices 120-1, 120-2, 120-3, and 120-4 going into a reduced power consumption mode while performing AI operations, the AI operations can be paused and data from the AI operations can be sent to the memory device 120-X and/or the one or more memory devices 120-1, 120-2, 120-3, and 120-4. When the one or more memory devices 120-1, 120-2, 120-3, and 120-4 are brought back to a normal operating mode and/or increased power consumption mode, the data from the AI operations can be sent back to the one or more memory devices 120-1, 120-2, 120-3, and 120-4 and the AI operations can continue from where they were paused.

In some examples, the AI operations can be completed prior to the one or more memory devices 120-1, 120-2, 120-3, and 120-4 going into a reduced power consumption mode. The one or more memory devices 120-1, 120-2, 120-3, and 120-4 can go into a reduced power consumption mode and/or the one or more memory devices 120-1, 120-2, 120-3, and 120-4 can go into a reduced power consumption mode except for the output of the AI operations. For example, the output can be refreshed until the output is read from the one or more memory devices 120-1, 120-2, 120-3, and 120-4. Once the output is read from the one or more memory devices 120-1, 120-2, 120-3, and 120-4, the one or more memory devices 120-1, 120-2, 120-3, and 120-4, including the output, can go into a reduced power consumption mode.

One or more of the memory devices 120-1, 120-2, 120-3, and 120-4 can send artificial intelligence (AI) data used to perform AI operations to one or more of the memory devices 120-1, 120-2, 120-3, and 120-4 that are performing AI operations. In some examples, the AI data to perform the AI operations can be sent to a different memory device to perform the AI operations in response to one or more of the memory devices 120-1, 120-2, 120-3, and 120-4 going into a reduced power consumption mode. For example, the AI operations and/or AI data can be sent to memory device 120-1 to perform the AI operations in response to memory device 120-2 going into a reduced power consumption mode. Other data, not related to the AI data, can be sent to a different memory device, for example, memory device 120-X in response to memory device 120-2 going into a reduced power consumption mode. In some examples, one or more of the memory devices 120-1, 120-2, 120-3, and 120-4 that were in a reduced power consumption mode can be in a normal operating mode and/or an increased power consumption mode in response to the one or more memory devices 120-1, 120-2, 120-3, and 120-4 that were performing the AI operations completing the AI operations.

Figure 2:
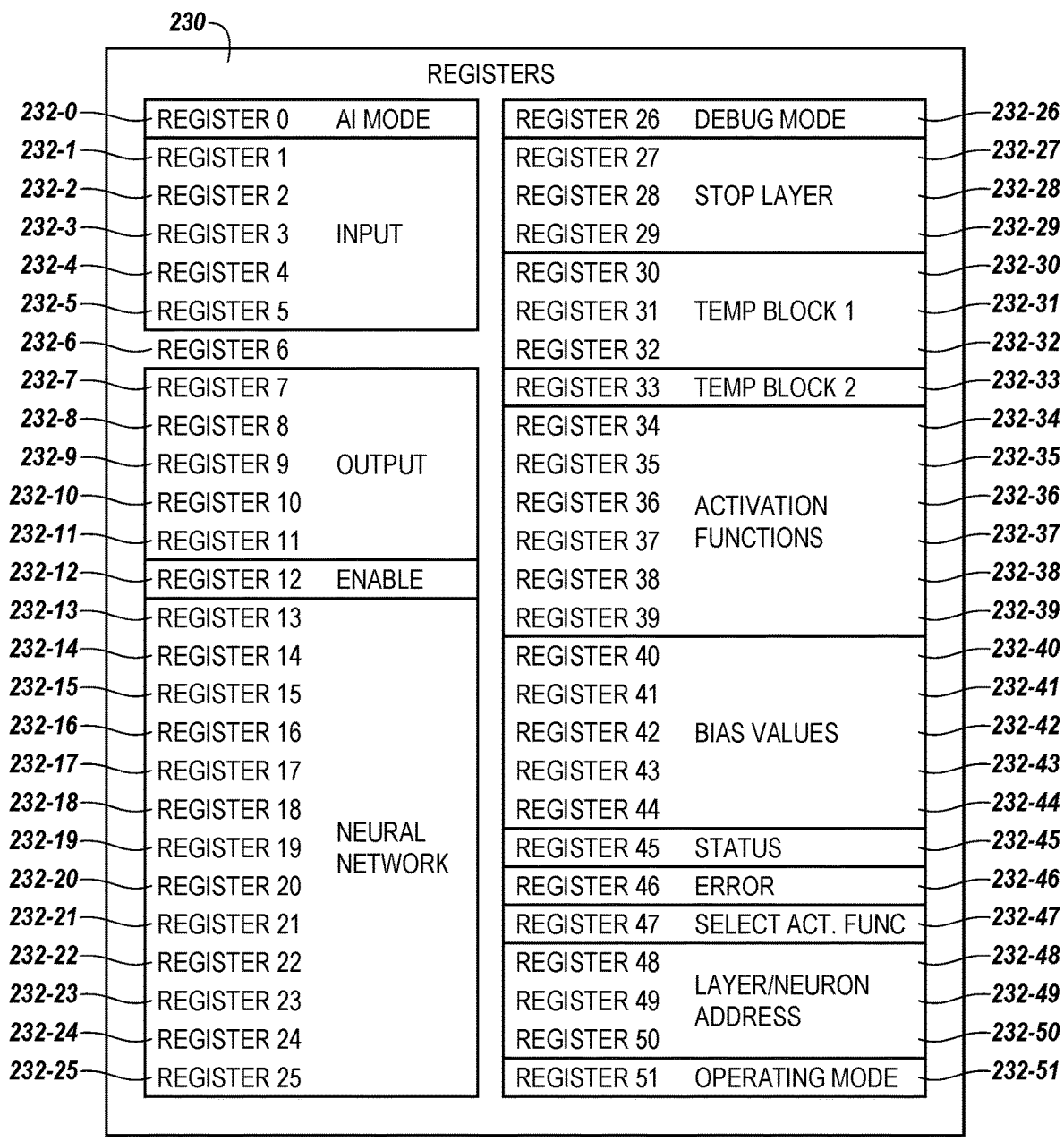
FIG. 2 is a block diagram of a number of registers on a memory device with an artificial intelligence (AI) accelerator in accordance with a number of embodiments of the present disclosure.

FIG. 2 is a block diagram of a number of registers on a memory device with an artificial intelligence (AI) accelerator in accordance with a number of embodiments of the present disclosure. Registers 230 can be AI registers and include input information, output information, neural network information, and/or activation functions information, among other types of information, for use by an AI accelerator, a controller, and/or memory arrays of a memory device (e.g., AI accelerator 124, memory controller 122, and/or memory arrays 125-1, . . . , 125-N in FIG. 1). Registers can be read and/or written to based on commands from a host, an AI accelerator, and/or a controller (e.g., host 102, AI accelerator 124, memory controller 122 in FIG. 1).

Register 232-0 can define parameters associated with AI mode of the memory device. Bits in register 232-0 can start AI operations, restart AI operations, indicate content in registers is valid, clear content from registers, and/or exit from AI mode.

Registers 232-1, 232-2, 232-3, 232-4, and 232-5 can define the size of inputs used in AI operations, the number of inputs used in AI operations, and the start address and end address of the inputs used in AI operations. Registers 232-7, 232-8, 232-9, 232-10, and 232-11 can define the size of outputs of AI operations, the number of outputs in AI operations, and the start address and end address of the outputs of AI operations.

Register 232-12 can be used to enable the usage of the input banks, the neuron banks, the output banks, the bias banks, the activation functions, and the temporary banks used during AI operations.

Registers 232-13, 232-14, 232-15, 232-16, 232-17, 232-18, 232-19, 232-20, 232-21, 232-22, 232-23, 232-24, and 232-25 can be used to define the neural network used during AI operations. Registers 232-13, 232-14, 232-15, 232-16, 232-17, 232-18, 232-19, 232-20, 232-21, 232-22, 232-23, 232-24, and 232-25 can define the size, number, and location of neurons and/or layers of the neural network used during AI operations.

Register 232-26 can enable a debug/hold mode of the AI accelerator and output to be observed at a layer of AI operations. Register 232-26 can indicate that an activation should be applied during AI operations and that the AI operation can step forward (e.g., perform a next step in an AI operation) in AI operations. Register 232-26 can indicate that the temporary blocks, where the output of the layer is located, is valid. The data in the temporary blocks can be changed by a host and/or a controller on the memory device, such that the changed data can be used in the AI operation as the AI operation steps forward. Registers 232-27, 232-28, and 232-29 can define the layer where the debug/hold mode will stop the AI operation, change the content of the neural network, and/or observe the output of the layer.

Registers 232-30, 232-31, 232-32, and 232-33 can define the size of temporary banks used in AI operations and the start address and end address of the temporary banks used in AI operations. Register 232-30 can define the start address and end address of a first temporary bank used in AI operations and register 232-33 can define the start address and end address of a first temporary bank used in AI operations. Registers 232-31, and 232-32 can define the size of the temporary banks used in AI operations.

Registers 232-34, 232-35, 232-36, 232-37, 232-38, and 232-39 can be associated with the activation functions used in AI operations. Register 232-34 can enable usage of the activation function block, enable usage of the activation function for each neuron, the activation function for each layer, and enables usage of an external activation function. Registers 232-35 can define the start address and the end address of the location of the activation functions. Registers 232-36, 232-37, 232-38, and 232-39 can define the resolution of the inputs (e.g., x-axis) and outputs (e.g., y-axis) of the activation functions and/or a custom defined activation function.

Registers 232-40, 232-41, 232-42, 232-43, and 232-44 can define the size of bias values used in AI operations, the number of bias values used in AI operations, and the start address and end address of the bias values used in AI operations.

Register 232-45 can provide status information for the AI calculations and provide information for the debug/hold mode. Register 232-45 can enable debug/hold mode, indicate that the AI accelerator is performing AI operations, indicate that the full capability of the AI accelerator should be used, indicate only matrix calculations of the AI operations should be made, and/or indicate that the AI operation can proceed to the next neuron and/or layer.

Register 232-46 can provide error information regarding AI operations. Register 232-46 can indicate that there was an error in a sequence of an AI operation, that there was an error in an algorithm of an AI operations, that there was an error in a page of data that ECC was not able to correct, and/or that there was an error in a page of data that ECC was able to correct.

Register 232-47 can indicate an activation function to use in AI operations. Register 232-47 can indicated one of a number of pre-define activation function can be used in AI operations and/or a custom activation function located in a block can be used in AI operations.

Registers 232-48, 232-49, and 232-50 can indicate the neuron and/or layer where the AI operation is executing. In the case where errors occur during the AI operations, registers 232-48, 232-49, and 232-50 the neuron and/or layer where an error occurred.

Register 232-51 can modify an operating mode of the memory device. A memory device controller can be enabled to modify the operating mode by writing a value indicative of the operating mode in register 232-51. The operating mode can be a reduced power consumption mode, an increased power consumption mode and/or a normal operating mode, for example.

FIGS. 3A and 3B are block diagrams of a number of bits in a number of registers on a memory device with an artificial intelligence (AI) accelerator in accordance with a number of embodiments of the present disclosure. Each register 332-0, . . . , 332-50 can include a number of bits, bits 334-0, 334-1, 334-2, 334-3, 334-4, 334-5, 334-6, and 334-7, to indicate information associated with performing AI operations.

Register 332-0 can define parameters associated with AI mode of the memory device. Bit 334-5 of register 332-0 can be a read/write bit and can indicate that an elaboration of an AI operation can restart 360 at the beginning when programmed to 1b. Bit 334-5 of register 332-0 can be reset to 0b once the AI operation has restarted. Bit 334-4 of register 332-0 can be a read/write bit and can indicate that an elaboration of an AI operation can start 361 when programmed to 1b. Bit 334-4 of register 332-0 can be reset to 0b once the AI operation has started.

Bit 334-3 of register 332-0 can be a read/write bit and can indicate that the content of the AI registers is valid 362 when programmed to 1b and invalid when programmed to 0b. Bit 334-2 of register 332-0 can be a read/write bit and can indicate that the content of the AI registers is to be cleared 363 when programmed to 1b. Bit 334-1 of register 332-0 can be a read only bit and can indicate that the AI accelerator is in use 363 and performing AI operations when programmed to 1b. Bit 334-0 of register 332-0 can be a write only bit and can indicate that the memory device is to exit 365 AI mode when programmed to 1b.

Registers 332-1, 332-2, 332-3, 332-4, and 332-5 can define the size of inputs used in AI operations, the number of inputs used in AI operations, and the start address and end address of the inputs used in AI operations. Bits 334-0, 334-1, 334-2, 334-3, 334-4, 334-5, 334-6, and 334-7 of registers 332-1 and 332-2 can define the size of the inputs 366 used in AI operations. The size of the inputs can indicate the width of the inputs in terms of number of bits and/or the type of input, such as floating point, integer, and/or double, among other types. Bits 334-0, 334-1, 334-2, 334-3, 334-4, 334-5, 334-6, and 334-7 of registers 332-3 and 332-4 can indicate the number of inputs 367 used in AI operations. Bits 334-4, 334-5, 334-6, and 334-7 of register 332-5 can indicate a start address 368 of the blocks in memory arrays of the inputs used in AI operations. Bits 334-0, 334-1, 334-2, and 334-3 of register 332-5 can indicate an end address 369 of the blocks in memory arrays of the inputs used in AI operations. If the start address 368 and the end address 369 is the same address, only one block of input is indicated for the AI operations.

Registers 332-7, 332-8, 332-9, 332-10, and 332-11 can define the size of outputs of AI operations, the number of outputs in AI operations, and the start address and end address of the outputs of AI operations. Bits 334-0, 334-1, 334-2, 334-3, 334-4, 334-5, 334-6, and 334-7 of registers 332-7 and 332-8 can define the size 370 of the outputs used in AI operations. The size of the outputs can indicate the width of the outputs in terms of number of bits and/or the type of output, such as floating point, integer, and/or double, among other types. Bits 334-0, 334-1, 334-2, 334-3, 334-4, 334-5, 334-6, and 334-7 of registers 332-9 and 332-10 can indicate the number of outputs 371 used in AI operations. Bits 334-4, 334-5, 334-6, and 334-7 of register 332-11 can indicate a start address 372 of the blocks in memory arrays of the outputs used in AI operations. Bits 334-0, 334-1, 334-2, and 334-3 of register 332-11 can indicate an end address 373 of the blocks in memory arrays of the outputs used in AI operations. If the start address 372 and the end address 373 is the same address, only one block of output is indicated for the AI operations.

Register 332-12 can be used to enable the usage of the input banks, the neuron banks, the output banks, the bias banks, the activation functions, and the temporary banks used during AI operations. Bit 334-0 of register 332-12 can enable the input banks 380, bit 334-1 of register 332-12 can enable the neural network banks 379, bit 334-2 of register 332-12 can enable the output banks 378, bit 334-3 of register 332-12 can enable the bias banks 377, bit 334-4 of register 332-12 can enable the activation function banks 376, and bit 334-5 and 334-6 of register 332-12 can enable a first temporary 375 banks and a second temporary bank 374.

Registers 332-13, 332-14, 332-15, 332-16, 332-17, 332-18, 332-19, 332-20, 332-21, 332-22, 332-23, 332-24, and 332-25 can be used to define the neural network used during AI operations. Bits 334-0, 334-1, 334-2, 334-3, 334-4, 334-5, 334-6, and 334-7 of registers 332-13 and 332-14 can define the number of rows 381 in a matrix used in AI operations. Bits 334-0, 334-1, 334-2, 334-3, 334-4, 334-5, 334-6, and 334-7 of registers 332-15 and 332-16 can define the number of columns 382 in a matrix used in AI operations.

Bits 334-0, 334-1, 334-2, 334-3, 334-4, 334-5, 334-6, and 334-7 of registers 332-17 and 332-18 can define the size of the neurons 383 used in AI operations. The size of the neurons can indicate the width of the neurons in terms of number of bits and/or the type of input, such as floating point, integer, and/or double, among other types. Bits 334-0, 334-1, 334-2, 334-3, 334-4, 334-5, 334-6, and 334-7 of registers 332-19, 332-20, and 322-21 can indicate the number of neurons 384 of the neural network used in AI operations. Bits 334-4, 334-5, 334-6, and 334-7 of register 332-22 can indicate a start address 385 of the blocks in memory arrays of the neurons used in AI operations. Bits 334-0, 334-1, 334-2, and 334-3 of register 332-5 can indicate an end address 386 of the blocks in memory arrays of the neurons used in AI operations. If the start address 385 and the end address 386 is the same address, only one block of neurons is indicated for the AI operations. Bits 334-0, 334-1, 334-2, 334-3, 334-4, 334-5, 334-6, and 334-7 of registers 332-23, 332-24, and 322-25 can indicate the number of layers 387 of the neural network used in AI operations.

Register 332-26 can enable a debug/hold mode of the AI accelerator and an output to be observed at a layer of AI operations. Bit 334-0 of register 332-26 can indicate that the AI accelerator is in a debug/hold mode and that an activation function should be applied 391 during AI operations. Bit 334-1 of register 332-26 can indicate that the AI operation can step forward 390 (e.g., perform a next step in an AI operation) in AI operations. Bit 334-2 and bit 334-3 of register 232-26 can indicate that the temporary blocks, where the output of the layer is located, is valid 388 and 389. The data in the temporary blocks can be changed by a host and/or a controller on the memory device, such that the changed data can be used in the AI operation as the AI operation steps forward.

Bits 334-0, 334-1, 334-2, 334-3, 334-4, 334-5, 334-6, and 334-7 of registers 332-27, 332-28, and 332-29 can define the layer where the debug/hold mode will stop 392 the AI operation and observe the output of the layer.

Registers 332-30, 332-31, 332-32, and 332-33 can define the size of temporary banks used in AI operations and the start address and end address of the temporary banks used in AI operations. Bits 334-4, 334-5, 334-6, and 334-7 of register 332-30 can define the start address 393 of a first temporary bank used in AI operations. Bits 334-0, 334-1, 334-2, and 334-3 of register 332-30 can define the end address 394 of a first temporary bank used in AI operations. Bits 334-0, 334-1, 334-2, 334-3, 334-4, 334-5, 334-6, and 334-7 of registers 332-31 and 332-32 can define the size 395 of the temporary banks used in AI operations. The size of the temporary banks can indicate the width of the temporary banks in terms of number of bits and/or the type of input, such as floating point, integer, and/or double, among other types. Bits 334-4, 334-5, 334-6, and 334-7 of register 332-33 can define the start address 396 of a second temporary bank used in AI operations. Bits 334-0, 334-1, 334-2, and 334-3 of register 332-34 can define the end address 397 of a second temporary bank used in AI operations.

Registers 332-34, 332-35, 332-36, 332-37, 332-38, and 332-39 can be associated with the activation functions used in AI operations. Bit 334-0 of register 332-34 can enable usage of the activation function block 3101. Bit 334-1 of register 332-34 can enable holding that AI at a neuron 3100 and usage of the activation function for each neuron. Bit 334-2 of register 332-34 can enable holding the AI at a layer 399 and the usage of the activation function for each layer. Bit 334-3 of register 332-34 can enable usage of an external activation function 398.

Bits 334-4, 334-5, 334-6, and 334-7 of register 332-35 can define the start address 3102 of activation function banks used in AI operations. Bits 334-0, 334-1, 334-2, and 334-3 of register 332-35 can define the end address 3103 of activation functions banks used in AI operations. Bits 334-0, 334-1, 334-2, 334-3, 334-4, 334-5, 334-6, and 334-7 of registers 332-36 and 332-37 can define the resolution of the inputs (e.g., x-axis) 3104 of the activation functions. Bits 334-0, 334-1, 334-2, 334-3, 334-4, 334-5, 334-6, and 334-7 of registers 332-38 and 332-39 can define the resolution and/or the outputs (e.g., y-axis) 3105 of the activation functions for a given x-axis value of a custom activation function.

Registers 332-40, 332-41, 332-42, 332-43, and 332-44 can define the size of bias values used in AI operations, the number of bias values used in AI operations, and the start address and end address of the bias values used in AI operations. Bits 334-0, 334-1, 334-2, 334-3, 334-4, 334-5, 334-6, and 334-7 of registers 332-40 and 332-41 can define the size of the bias values 3106 used in AI operations. The size of the bias values can indicate the width of the bias values in terms of number of bits and/or the type of bias values, such as floating point, integer, and/or double, among other types. Bits 334-0, 334-1, 334-2, 334-3, 334-4, 334-5, 334-6, and 334-7 of registers 332-42 and 332-43 can indicate the number of bias values 3107 used in AI operations. Bits 334-4, 334-5, 334-6, and 334-7 of register 332-44 can indicate a start address 3108 of the blocks in memory arrays of the bias values used in AI operations. Bits 334-0, 334-1, 334-2, and 334-3 of register 332-44 can indicate an end address 3109 of the blocks in memory arrays of the bias values used in AI operations. If the start address 3108 and the end address 3109 is the same address, only one block of bias values is indicated for the AI operations.

Register 332-45 can provide status information for the AI calculations and provide information for the debug/hold mode. Bit 334-0 of register 332-45 can activate the debug/hold mode 3114. Bit 334-1 of register can indicate that the AI accelerator is busy 3113 and performing AI operations. Bit 334-2 of register 332-45 can indicate that the AI accelerator is on 3112 and/or that the full capability of the AI accelerator should be used. Bit 334-3 of register 332-45 can indicate only matrix calculations 3111 of the AI operations should be made. Bit. 334-4 of register 332-45 can indicate that the AI operation can step forward 3110 and proceed to the next neuron and/or layer.

Register 332-46 can provide error information regarding AI operations. Bit 334-3 of register 332-46 can indicate that there was an error in a sequence 3115 of an AI operation. Bit 334-2 of register 332-46 can indicate that there was an error in an algorithm 3116 of an AI operation. Bit 334-1 of register 332-46 can indicate there was an error in a page of data that ECC was not able to correct 3117. Bit 334-0 of register 332-46 can indicate there was an error in a page of data that ECC was able to correct 3118.

Register 332-47 can indicate an activation function to use in AI operations. Bits 334-0, 334-1, 334-2, 334-3, 334-4, 334-5, and 334-6 of register 332-47 can indicate one of a number of pre-define activation functions 3120 can be used in AI operations. Bit 334-7 of register 332-47 can indicate a custom activation function 3119 located in a block can be used in AI operations.

Registers 332-48, 332-49, and 332-50 can indicate the neuron and/or layer where the AI operation is executing. Bits 334-0, 334-1, 334-2, 334-3, 334-4, 334-5, 334-6, and 334-7 of registers 332-48, 332-49, and 332-50 can indicate the address of the neuron and/or layer where the AI operation is executing. In the case where errors occur during the AI operations, registers 332-48, 332-49, and 332-50 can indicate the neuron and/or layer where an error occurred.

Register 332-51 can modify an operating mode of the memory device. Bits 334-0, 334-1, 334-2, 334-3, 334-4, 334-5, 334-6, and 334-7 of register 332-51 can enable the operating mode of one or more memory devices to be modified. For example, bit 334-0 can be programmed (e.g., written) to a first state (e.g., first value) to modify the operating mode of a first memory device to a reduced power consumption mode and/or programmed to a second state (e.g., second value) to modify the operating mode of the first memory device to an increased power consumption mode and/or a normal operating mode. In some examples, the first memory device could be assigned a binary number using one or more of the bits 334-0, 334-1, 334-2, 334-3, 334-4, 334-5, 334-6, and 334-7 to modify the operating mode of the first memory device. For example, the first memory device could be placed in a reduced power consumption mode in response to bits 334-0, 334-2, 334-4, and 334-6 being programmed to the first state and bits 334-1, 334-3, 334-5, and 334-7 being programmed to the second state and placed in an increased power consumption mode and/or a normal operating mode in response to bits 334-0, 334-2, 334-4, and 334-6 being programmed to the second state and bits 334-1, 334-3, 334-5, and 334-7 being programmed to the first state.

The memory device can receive a mode register write command from the host controller and/or the memory system controller to modify the operating mode of a memory device. In some examples, when the memory device is in the reduced power consumption mode, the register 332-51 can only accept a mode register write command to place the memory device in an increased power consumption mode and/or a normal operating mode. Limiting the number of commands the register can accept can reduce the amount of power consumed by the memory device in the reduced power consumption mode.

Figure 4:
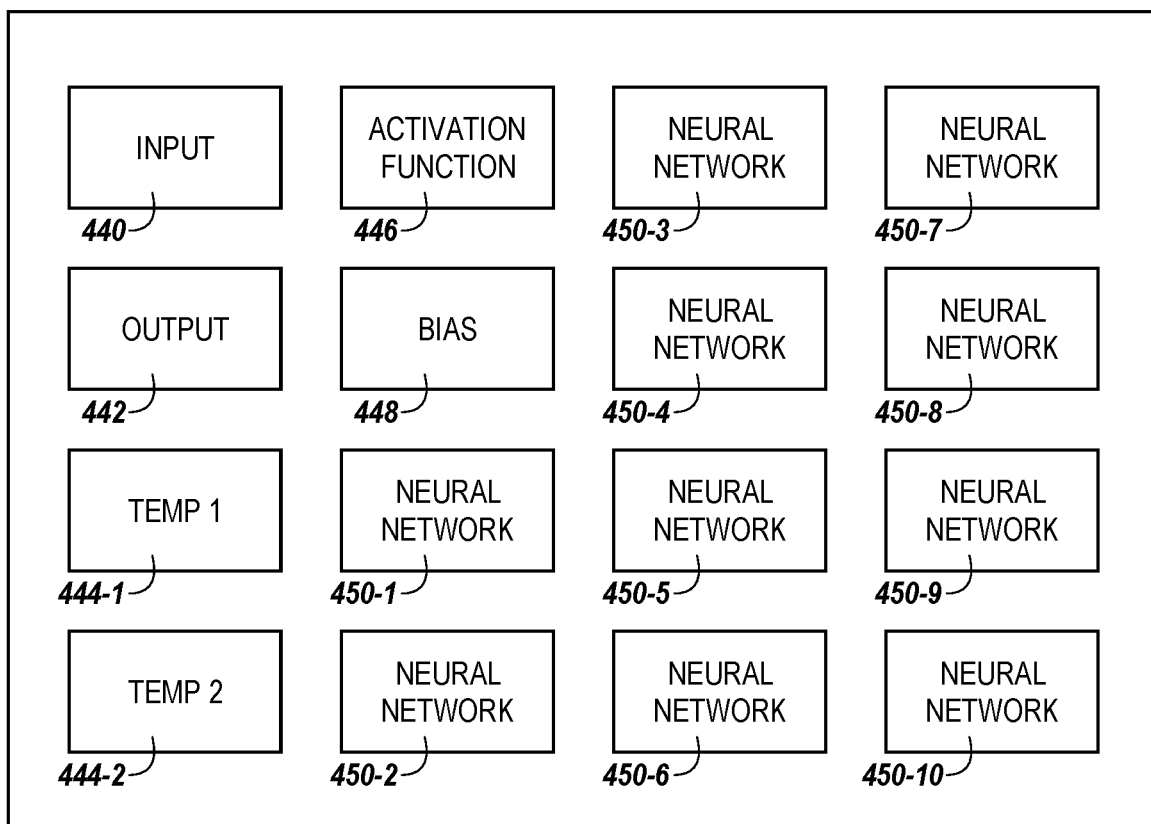
FIG. 4 is a block diagram of a number of blocks of a memory device with an artificial intelligence (AI) accelerator in accordance with a number of embodiments of the present disclosure

FIG. 4 is a block diagram of a number of blocks of a memory device with an artificial intelligence (AI) accelerator in accordance with a number of embodiments of the present disclosure. Input block 440 is a block in the memory arrays where input data is stored. Data in input block 440 can be used as the input for AI operations. The address of input block 440 can be indicated in register 5 (e.g. register 232-5 in FIGS. 2 and 332-5 in FIG. 3A). Embodiments are not limited to one input block as there can be a plurality of input blocks. Data input block 440 can be sent to the memory device from the host. The data can accompany a command indicated that AI operations should be performed on the memory device using the data.

Output block 420 is a block in the memory arrays where output data from AI operations is stored. Data in output block 442 can be used store the output from AI operations and sent to the host. The address of output block 442 can be indicated in register 11 (e.g. register 232-11 in FIGS. 2 and 332-11 in FIG. 3A). Embodiments are not limited to one output block as there can be a plurality of output blocks.

Data in output block 442 can be sent to host upon completion and/or holding of an AI operation. Temporary blocks 444-1 and 444-2 can be blocks in memory arrays where data is stored temporarily while AI operations are being performed. Data can be stored in temporary blocks 444-1 and 444-2 while the AI operations are iterating through the neuron and layers of the neural network used for the AI operations. The address of temporary block 448 can be indicated in registers 30 and 33 (e.g. registers 232-30 and 232-33 in FIGS. 2 and 332-30 and 332-33 in FIG. 3B). Embodiments are not limited to two temporary blocks as there can be a plurality of temporary blocks.

Activation function block 446 is a block in the memory arrays where the activations functions for the AI operations are stored. Activation function block 446 can store pre-defined activation functions and/or custom activation functions that are created by the host and/or AI accelerator. The address of activation function block 448 can be indicated in register 35 (e.g. register 232-35 in FIGS. 2 and 332-35 in FIG. 3B). Embodiments are not limited to one activation function block as there can be a plurality of activation function blocks.

Bias values block 448 is a block in the memory array where the bias values for the AI operations are stored. The address of bias values block 448 can be indicated in register 44 (e.g. register 232-44 in FIGS. 2 and 332-44 in FIG. 3B). Embodiments are not limited to one bias value block as there can be a plurality of bias value blocks.

Neural network blocks 450-1, 450-2, 450-3, 450-4, 450-5, 450-6, 450-7, 450-8, 450-9, and 450-10 are a block in the memory array where the neural network for the AI operations are stored. Neural network blocks 450-1, 450-2, 450-3, 450-4, 450-5, 450-6, 450-7, 450-8, 450-9, and 450-10 can store the information for the neurons and layers that are used in the AI operations. The address of neural network blocks 450-1, 450-2, 450-3, 450-4, 450-5, 450-6, 450-7, 450-8, 450-9, and 450-10 can be indicated in register 22 (e.g. register 232-22 in FIGS. 2 and 332-22 in FIG. 3A).

Figure 5:
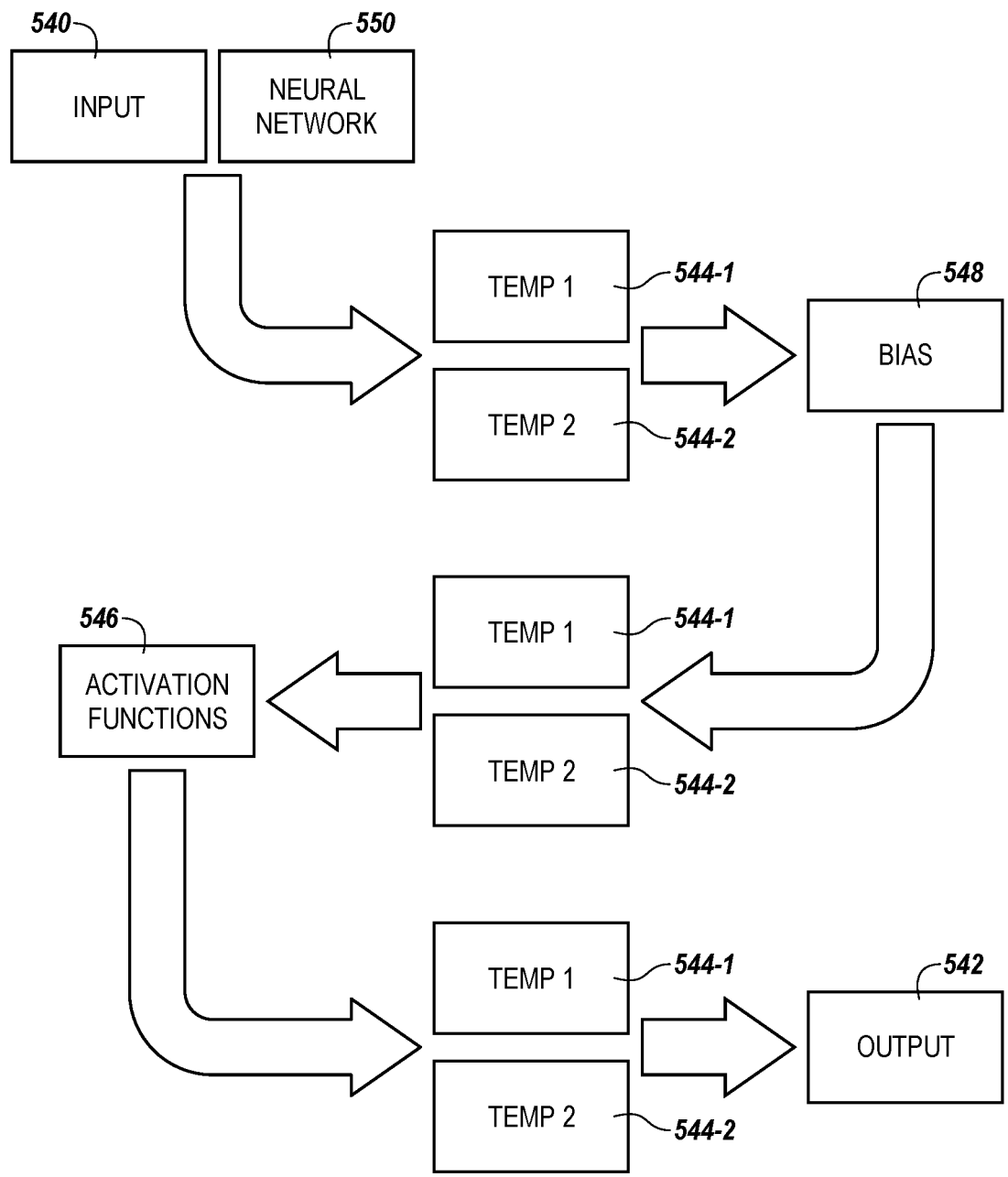
FIG. 5 is a flow diagram illustrating an example artificial intelligence process in a memory device with an artificial intelligence (AI) accelerator in accordance with a number of embodiments of the present disclosure.

FIG. 5 is a flow diagram illustrating an example artificial intelligence process in a memory device with an artificial intelligence (AI) accelerator in accordance with a number of embodiments of the present disclosure. In response to staring an AI operation, an AI accelerator can write input data 540 and neural network data 550 to the input and neural network block, respectively. The AI accelerator can perform AI operations using input data 540 and neural network data 550. The results can be stored in temporary banks 544-1 and 544-2. The temporary banks 544-1 and 544-2 can be used to store data while performing matrix calculations, adding bias data, and/or to applying activation functions during the AI operations.

An AI accelerator can receive the partial results of AI operations stored in temporary banks 544-1 and 544-2 and bias value data 548 and perform AI operations using the partial results of AI operations bias value data 548. The results can be stored in temporary banks 544-1 and 544-2.

An AI accelerator can receive the partial results of AI operations stored in temporary banks 544-1 and 544-2 and activation function data 546 and perform AI operations using the partial results of AI operations and activation function data 546. The results can be stored in output banks 542.

Figure 6:
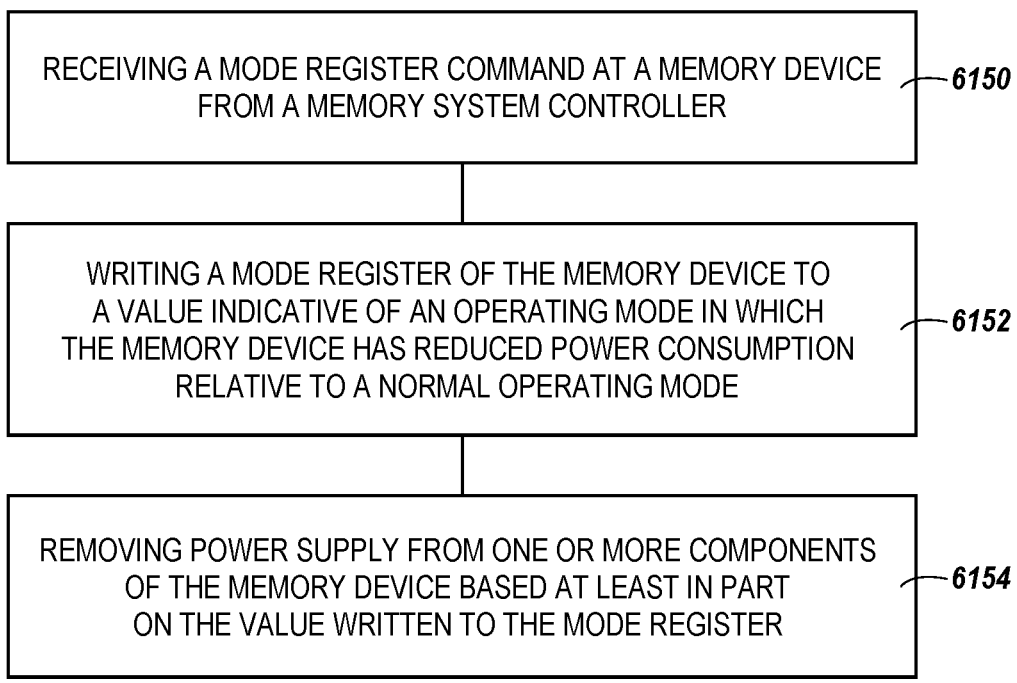
FIG. 6 is a flow diagram illustrating an example method to modify an operating mode in memory in accordance with a number of embodiments of the present disclosure.

FIG. 6 is a flow diagram illustrating an example method to modify an operating mode in memory in accordance with a number of embodiments of the present disclosure. The method described in FIG. 6 can be performed by, for example, a memory system including a memory device such as memory device 120 shown in FIGS. 1A and 1B.

At block 6150, the method can include receiving a mode register write command at a memory device from a memory system controller. The memory system controller can send a command to modify the operating mode of the memory device and/or to perform AI operations. In some examples, the memory system can send the command to modify the operating mode of the memory device to a reduced power consumption mode, an increased power consumption mode, or a full power consumption mode.

At block 6152, the method can include writing a mode register of the memory device to a value indicative of an operating mode in which the memory device has reduced power consumption relative to a normal operating mode. In some examples, when the memory device has reduced power consumption, the memory device does not perform refresh operations and the command interface only accepts commands to place the memory device in an increased power consumption mode and/or a normal operating mode that has increased power consumption relative to the reduced power consumption mode.

In some examples, AI operations can be completed prior to the memory device going into a reduced power consumption mode. The entire memory device can go into a reduced power consumption mode and/or the memory device can go into a reduced power consumption mode except for an output from the AI operations. For example, the output can be refreshed until the output is read from the memory device. Once the output is read from the memory device, the entire memory device, including the output, can go into a reduced power consumption mode.

At block 6154, the method can include removing power supply from one or more components of the memory device based at least in part on the value written to the mode register. In some examples, power supply can be maintained to a command/address bus of the memory device and the power supply can be removed from other components of the memory device. The power supply to the command/address bus can be maintained based at least in part on a minimum power level for the memory device to receive mode register write or mode register read commands. In a number of embodiments, power can be maintained to at least one DRAM of the memory device and the one or more components from which the power supply is removed can include another DRAM of the memory device.

Although specific embodiments have been illustrated and described herein, those of ordinary skill in the art will appreciate that an arrangement calculated to achieve the same results can be substituted for the specific embodiments shown. This disclosure is intended to cover adaptations or variations of various embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the various embodiments of the present disclosure includes other applications in which the above structures and methods are used. Therefore, the scope of various embodiments of the present disclosure should be determined with reference to the appended claims, along with the full range of equivalents to which such claims are entitled.

In the foregoing Detailed Description, various features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
   a memory array; and
   a controller comprising a mode register, wherein the controller is configured to:
   receive a mode register write command;
   write the mode register to a value indicative of an operating mode in which the apparatus has increased power consumption relative to a normal operating mode in response to receiving the mode register write command, wherein one or more memory devices have reduced power consumption relative to the normal operating mode to allow more power to be directed to the apparatus; and
   perform an artificial intelligence (AI) operation within the apparatus in response to writing the mode register to the value indicative of the operating mode in which the apparatus has increased power consumption relative to the normal operating mode and inhibits access to registers associated with normal operation of the apparatus.

2. The apparatus of claim 1, further comprising an AI accelerator configured to perform the AI operation.

3. The apparatus of claim 1, wherein the controller further comprises a number of registers.

4. The apparatus of claim 1, wherein the apparatus is a dynamic random-access memory (DRAM).

5. The apparatus of claim 1, wherein the apparatus is a low-power double data rate DRAM device or a graphics double data rate DRAM device.

6. A method, comprising:
   placing a first memory device in a reduced power consumption mode relative to a normal operating mode;
   directing more power to a second memory device in response to placing the first memory device in the reduced power consumption mode, wherein the first memory device is placed in the reduced power consumption mode to allow more power to be directed to the second memory device; and
   performing an artificial intelligence (AI) operation at the second memory device in response to directing more power to the second memory device and writing a mode register to a value indicative of an operating mode in which the second memory device has increased power consumption relative to the normal operating mode and inhibits access to registers associated with normal operation of the second memory device.

7. The method of claim 6, further comprising sending AI data from the first memory device to the second memory device prior to the first memory device being placed in the reduced power consumption mode.

8. The method of claim 6, further comprising placing the first memory device in the reduced power consumption mode by removing a power supply to the first memory device.

9. The method of claim 6, further comprising ignoring refresh operations at the first memory device in response to placing the first memory device in the reduced power consumption mode.

10. The method of claim 6, further comprising changing an operating mode of the first memory device to the normal operating mode or an increased power consumption mode in response to receiving a command.

11. The method of claim 6, further comprising sending a result of the AI operation in response to performing the AI operation.

12. A system, comprising:
    a memory system controller;
    a first memory device coupled to the memory system controller, wherein the first memory device includes a first memory array and a first memory device controller configured to:
    receive a first mode register write command from the memory system controller; and
    write a first mode register of the first memory device to a value indicative of a first operating mode in which the first memory device has reduced power consumption relative to a normal operating mode; and
    a second memory device coupled to the memory system controller, wherein the second memory device includes a second memory array and a second memory device controller configured to:
    receive a second mode register write command from the memory system controller;
    write a second mode register of the second memory device to a second value indicative of a second operating mode in which the second memory device has increased power consumption relative to the normal operating mode, wherein the first memory device is placed in the first operating mode in which the first memory device has reduced power consumption relative to the normal operating mode to allow more power to be directed to the second memory device; and
    perform an artificial intelligence (AI) operation within the second memory device in response to writing the second mode register of the second memory device to the second value indicative of the second operating mode in which the second memory device has increased power consumption relative to the normal operating mode and inhibits access to registers associated with normal operation of the second memory device.

13. The system of claim 12, wherein the first memory device controller is configured to maintain power supply to a command/address bus of the first memory device.

14. The system of claim 13, wherein the power supply maintained to the command/address bus is based at least in part on a minimum power level for the first memory device to receive mode register write or mode register read commands.

15. The system of claim 12, wherein the first memory device controller is configured to receive a third mode register write command at the first memory device.

16. The system of claim 15, wherein the first memory device controller is configured to write the first mode register of the first memory device to a third value that is indicative of the normal operating mode in response to receiving the third mode register write command at the first memory device.

17. The system of claim 16, wherein the first memory device controller is configured to restore power supply to the first memory device based at least in part on the third value written to the first mode register.

18. The system of claim 12, further comprising a first select line and a second select line.

19. The system of claim 18, wherein the first select line couples the memory system controller to the first memory device and a third memory device and the second select line couples the memory system controller to the second memory device and a fourth memory device.

20. The system of claim 19, wherein the memory system controller is configured to send the first mode register write command to the first memory device via the first select line and the second mode register write command to the second memory device via the second select line.

* * * * *